United States Patent
Chan et al.

(10) Patent No.: US 9,635,760 B1
(45) Date of Patent: Apr. 25, 2017

(54) 0204 SHIFTED VIAS WITH MERGE PADS

(71) Applicant: ALCATEL-LUCENT CANADA INC., Ottawa (CA)

(72) Inventors: Alex L. Chan, Nepean (CA); Paul J. Brown, Wakefield (CA)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 15/000,941

(22) Filed: Jan. 19, 2016

(51) Int. Cl.
| | |
|---|---|
| *H05K 7/10* | (2006.01) |
| *H05K 1/11* | (2006.01) |
| *H05K 3/00* | (2006.01) |
| *H05K 3/34* | (2006.01) |
| *H05K 3/40* | (2006.01) |

(52) U.S. Cl.
CPC ........... *H05K 1/113* (2013.01); *H05K 3/0005* (2013.01); *H05K 3/3452* (2013.01); *H05K 3/4038* (2013.01)

(58) Field of Classification Search
CPC .... H05K 1/113; H05K 3/0005; H05K 3/3452; H05K 3/4038
USPC ................................. 361/760, 767, 768, 782
See application file for complete search history.

(56) References Cited

U.S. PATENT DOCUMENTS

| | | | | |
|---|---|---|---|---|
| 8,031,480 B2 * | 10/2011 | Togashi | ................ | H01G 2/065 361/760 |
| 2004/0179855 A1 | 9/2004 | Harada | | |
| 2005/0173151 A1 * | 8/2005 | Shepherd | ............... | H05K 1/114 174/250 |
| 2006/0166398 A1 * | 7/2006 | Chan | ................ | H01L 23/49816 438/106 |
| 2007/0092256 A1 | 4/2007 | Nozuo et al. | | |
| 2009/0196602 A1 | 8/2009 | Saunderse et al. | | |
| 2009/0297151 A1 | 12/2009 | Yoneda et al. | | |
| 2010/0272431 A1 | 10/2010 | Chen | | |
| 2012/0168216 A1 * | 7/2012 | Chan | ................... | H05K 1/0231 174/260 |

FOREIGN PATENT DOCUMENTS

EP     2566082 A1     3/2013

OTHER PUBLICATIONS

Notification of Transmittal of the International Search Report, and the Written Opinion of the International Searching Authority for PCT/US2016/059971 dated Feb. 6, 2017.
Teipen, Flexible Bandwidth and Bit-Rate Programmability in Future Optical Networks, 2012 14th International conference on Transparent Optical Networks (ICTON), Coventry, UK 205 Jul. 2012.

* cited by examiner

*Primary Examiner* — Hoa C Nguyen
(74) *Attorney, Agent, or Firm* — Kramer & Amado, P.C.

(57) ABSTRACT

A printed circuit board design for 0204 reverse geometry capacitor use between vias on a tight-pitch Ball Grid Array is disclosed. The printed circuit board design for 0204 reverse geometry capacitor use between vias on a tight-pitch Ball Grid Array provides component landing pads sized to accommodate an 0204 surface mount component within a 1.2 mm by 1.0 mm rectangular spacing. The printed circuit board design for 0204 reverse geometry capacitor use between vias on a tight-pitch Ball Grid Array is particularly useful for overcoming the problem of component placement on tight-pitch arrays known in the art.

6 Claims, 5 Drawing Sheets

US 9,635,760 B1

0204 SHIFTED VIAS WITH MERGE PADS

TECHNICAL FIELD

The present invention relates to a printed circuit board pad design and is particularly concerned with providing component placement on very tight-pitch grid arrays.

BACKGROUND

High-speed electronic applications require the mounting of very small components, for example decoupling capacitors, on very tight-pitch grid arrays which are compatible with Ball Grid Array (BGA) components. Examples of very tight-pitch grids include 0.8 mm by 0.8 mm pitch and 1.0 mm by 1.0 mm pitch grids among others.

Power supply decoupling challenges are emerging from designs with operating frequencies of 300 MHz or greater, integrated circuits with operating voltages below 3 volts and power demand of 15 watts or more. The higher operating frequencies, the ever shrinking lower and upper voltage limits given low operating voltages and the larger power demands all combine to demand higher performance from decoupling arrangements.

An ideal decoupling capacitor would transfer all its stored energy to a load instantly. A real capacitor has parasitics that prevent instantaneous transfer of a capacitor's stored energy. The actual operating nature of a capacitor can be modeled as an RLC equivalent circuit. For most purposes, it is possible to model the characteristics of an actual capacitor with the series combination of one capacitor, one resistor, and one inductor. The resistive, inductive, and capacitive values in this model are commonly referred to as equivalent-series-capacitance (ESC), equivalent-series-resistance (ESR), and equivalent-series-inductance (ESL).

The equivalent-series-inductance of a capacitor determines the speed of energy transfer to a load. The lower the ESL of an actual capacitor, the faster that energy can be transferred to a load. Historically, there has been a tradeoff between energy storage (capacitance) and inductance (speed of energy delivery) in a particular device. Low equivalent-series-inductance devices typically have low capacitance. Likewise, higher capacitance devices typically have higher ESLs. The equivalent-series-inductance of the capacitor has a further inductance added to it by the equivalent-series-inductance of the printed circuit board traces that connect the capacitor to the load—typically an integrated circuit. This drives a design topology that places the fastest low ESL capacitors as close to the load as possible to minimize the total equivalent-series-inductance.

The key physical characteristic determining equivalent-series-inductance of a capacitor is the size of the current loop it creates. The smaller the current loop, the lower the resulting ESL. A standard surface mount capacitor is rectangular in shape with electrical terminations on its shorter sides. There now exists versions of surface mount capacitors known as Reverse Geometry Capacitors (RGCs) which have its terminations on the longer side of its rectangular shape.

Surface mount capacitors have a size characterized by a four digit number of the form "XXYY" wherein "XX" designates the length of one pair of sides, and "YY" designates the length of the other pair of sides which have electrical terminations; and wherein both lengths are in hundredths of an inch. By way of example, a "0402" capacitor would have nominal dimensions of 0.04" by 0.02" and the ends with length 0.02" would possess the solder terminals. Alternatively, a "0204" capacitor would have nominal dimensions of 0.02" by 0.04" and the ends with length 0.04" would possess the solder terminals. Referring to FIG. 1, there may be seen an example of a 0402 capacitor 100 having electrodes 102, and a 0204 capacitor 110 having electrodes 102.

When the distance between the electrodes on the chip capacitor is reduced, the size of the overall current loop is reduced. Since the size of the current loop is the primary driver of equivalent-series-inductance, a 0306 capacitor with a smaller current loop has significantly lower ESL then a 0603 capacitor. Manufacturer reports indicate that the reduction in equivalent-series-inductance varies by standard size increments of the chip capacitors; however, ESL is typically reduced 60% or more with a Reverse Geometry Capacitor versus a standard chip capacitor.

Therefore, it would be desirable to provide a method of placing Reverse Geometry components, including capacitors, within tight-pitch BGAs.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

According to an aspect of the invention there is provided a printed circuit board (PCB) having: a ball grid array (BGA) of BGA pads on one side of the PCB, arranged in a tight-pitch grid pattern; vias, including respective via pads, arranged in the grid pattern and at least one of the vias electrically connected to the BGA pads; a set of four of the vias spaced in a rectangular arrangement of dimensions 1.2 mm by 1.0 mm; two diagonally opposite of the set of vias having component landing pads; a solder mask covering the component landing pads with an opening; a solder pad within each the opening electrically connected to the component landing pad; and a two-lead component attached to the solder pad.

In some embodiments of this aspect of the invention the component landing pads accommodate an 0204 nominally dimensioned component. In some of these embodiments the component landing pads comprise a component landing pad of substantially rectangular shape, while in some of these embodiments the component landing pads further comprise a supplemental conductive area.

In some embodiments of this aspect of the invention at least one the component landing pads has an edge angled at about 70° to a side of the rectangle defined by the four vias.

In yet other embodiments of this aspect of the invention the component landing pads accommodate a plurality of 0201 nominally dimensioned components.

According to another aspect of the invention there is provided a method of manufacturing a PCB wherein the PCB has a ball grid array (BGA) of BGA pads on one side of the PCB arranged in a grid pattern, and wherein on the opposite side of the PCB has vias, including respective via pads, arranged in the grid pattern with at least one of the vias electrically connected to the BGA pads; the method having the steps of: selecting an adjacent set of four of the vias spaced in a rectangular arrangement of dimensions 1.2 mm by 1.0 mm vias on the PCB, wherein two diagonally opposite of the set of vias having component landing pads;

covering the component landing pads with a solder mask; removing areas from the solder masks; placing solder pads in the areas; and attaching a two-lead component to the two adjacent component pads using the solder pads.

In some embodiments of this aspect of the invention the component landing pads accommodate a 0204 nominally dimensioned component. In some of these embodiments the component landing pads comprise a component landing pad of substantially rectangular shape, while in some of these embodiments the component landing pads further comprise a supplemental conductive area.

In some embodiments of this aspect of the invention at least one of the component landing pads has an edge angled at about 70° to a side of the rectangle defined by the four vias.

In yet other embodiments of this aspect of the invention the component landing pads accommodate a plurality of 0201 nominally dimensioned components.

According to yet another aspect of the invention there is provided a computer aided design tool implemented on a computing device for accommodating a two-lead component on a tight pitch ball grid array (BGA) wherein the PCB will have a ball grid array (BGA) of BGA pads on one side of the PCB arranged in a grid pattern, and wherein on the opposite side of the PCB will be vias, including respective via pads, arranged in the grid pattern with at least one of the vias electrically connected to the BGA pads having: a design tool mode configured to select an adjacent set of four of the vias spaced in a rectangular arrangement of dimensions 1.2 mm by 1.0 mm vias on the PCB; a design tool mode configured to identify a placement of component landing pads and shaped of component landing pads on two diagonally opposite vias of the rectangular arrangement; wherein the placement allows a two-lead 0204 component to connect to the component landing pads, and wherein the spacing between component landing pads and adjacent non-connected vias meets a pre-established requirement.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
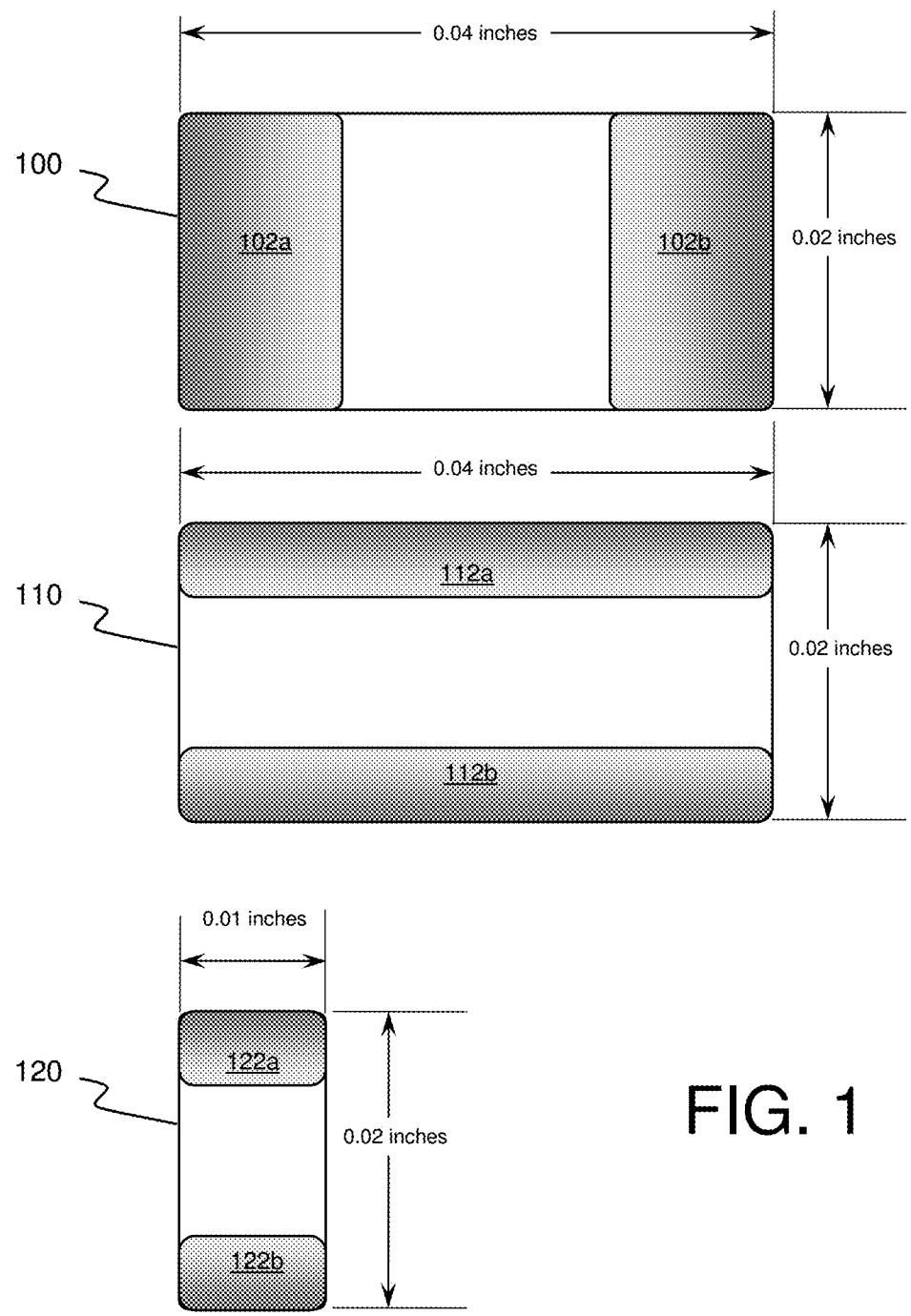
FIG. 1 shows a top view of an exemplary 0402 surface mount capacitor and an exemplary 0204 reverse geometry surface mount capacitor.

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments may be combined with one or more other embodiments to form new embodiments.

Referring now to the drawings, in which like numerals refer to like components or steps, there are disclosed broad aspects of various exemplary embodiments.

FIG. 1 shows a top view of an exemplary 0402 surface mount capacitor 100 having electrodes 102a and 102b and an exemplary 0204 reverse geometry surface mount capacitor 112 having electrodes 112a and 112b both having nominal physical dimensions illustrated. Also shown for reference is an exemplary 0201 surface mount capacitor 120 having electrodes 122a and 122b along with its nominal physical dimensions.

Figure 2:
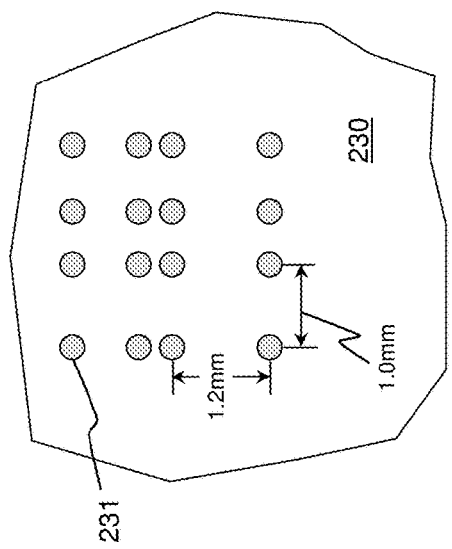
FIG. 2 shows a bottom view of portions of a fine-pitch circuit board having different grid spacings according to embodiments of the invention.
Figure 2:
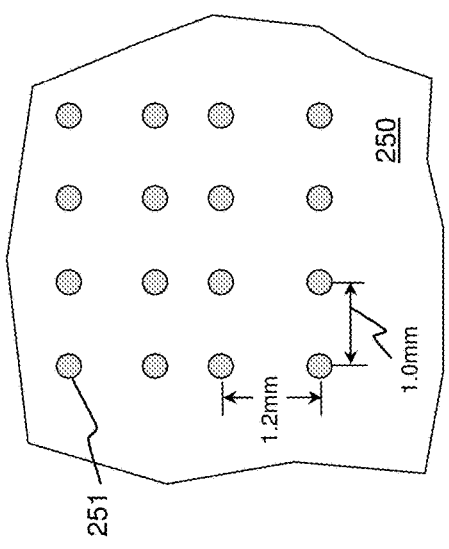
Figure 2:
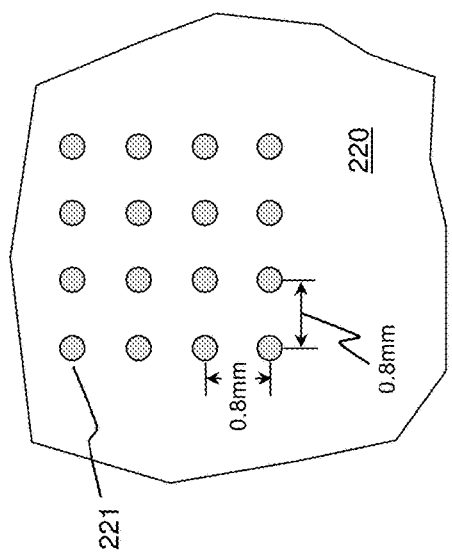
Figure 2:
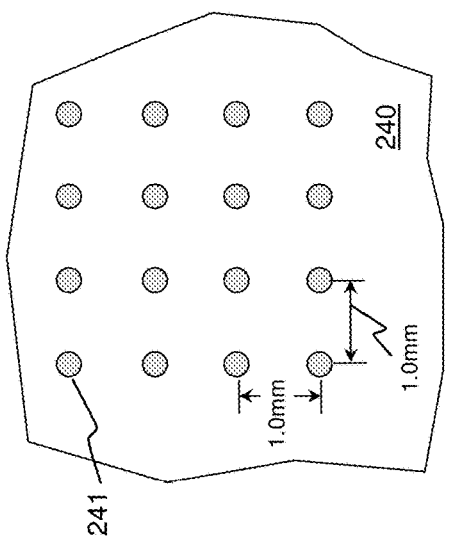

FIG. 2 shows bottom views of a portion of a fine-pitch circuit board according to embodiments of the invention. Circuit board portion 220 depicts a portion of a grid of vias on a circuit board which contains a standard ball grid array (BGA) of BGA pads on the top side (not shown) and a set of vias 221 also arranged on a grid spaced which is offset from the BGA pad grid, such that they do not overlap the BGA pads. The vias 221 are spaced on a grid spacing of 0.8 mm. Circuit board portion 230 depicts a similar portion of a grid of vias on a circuit board wherein one of the rows of vias has been displaced to effect a 1.2 mm row spacing, and one of the columns has been displaced to effect a 1.0 mm column spacing. The two displacements provide a set of vias defining a rectangular area of 1.2 mm by 1.0 mm which will allow placement of a 0204 component as will be described below in an embodiment of the invention.

Referring now to circuit board portion 240 there may be seen a portion of a grid of vias on a circuit board which contains a standard ball grid array (BGA) of BGA pads on the top side (not shown) and a set of vias 241 also arranged on a grid spaced which is offset from the BGA pad grid, such that they do not overlap the BGA pads. The vias 241 are spaced on a grid spacing of 1.0 mm. Circuit board portion 250 depicts a similar portion of a grid of vias on a circuit board wherein one of the rows of vias has been displaced to effect a 1.2 mm row spacing. This displacement also provides a set of vias defining a rectangular area of 1.2 mm by 1.0 mm which will allow placement of a 0204 component as will be described below in an embodiment of the invention.

Figure 3:
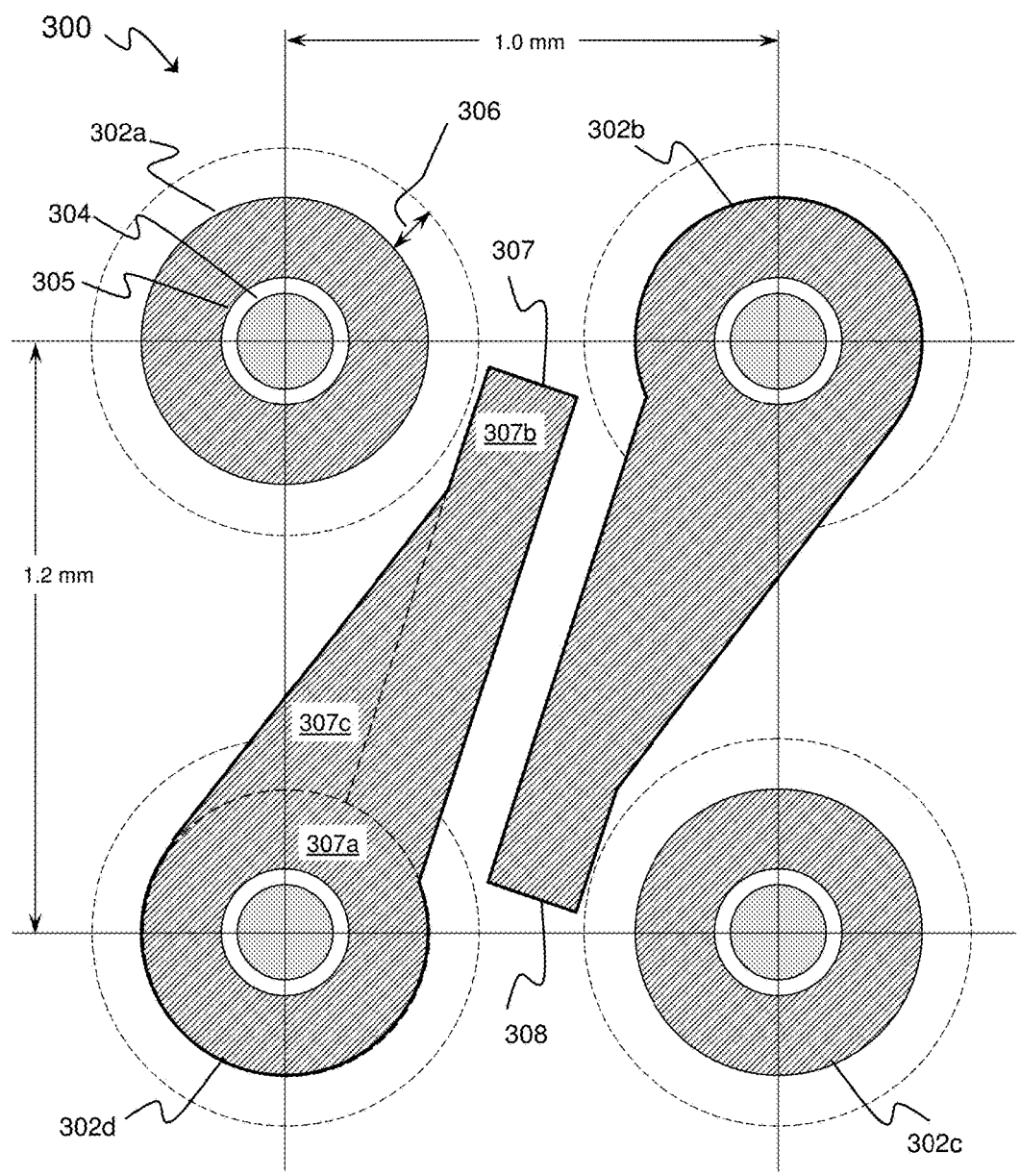
FIG. 3 shows a bottom view of a portion of a fine-pitch circuit board having according to an embodiment of the invention.

FIG. 3 shows a bottom view of a portion of a fine-pitch circuit board according to an embodiment of the invention. This includes a portion of a circuit board 300, which contains a standard ball grid array (BGA) of BGA pads on the top side (not shown) and a set of vias also arranged on a grid spaced which is offset from the BGA pad grid, such that they do not overlap the BGA pads. The vias have pads 302 are which are labeled (302a, 302b, 302c, and 302d), but other vias may be present outside of the rectangular area defined by these vias. In an exemplary embodiment BGA pads 302 form a rectangular spacing, meaning that vias pads 302a, 302b, 302c, and 302d are spaced 0.80 mm center-to-center apart in a square grid.

The standard structure of the vias includes via pad 302a and via 304, having via barrel 305. Typically, via pad 302a will be substantially circular in shape; and via 304 will be substantially circular in shape and have a radius of 0.25 mm. All dimensions may have a tolerance of ±10%. Via barrel 305 has an outer radius to fit in via 304. Via pad 302a has an insulative offset distance 306 indicated by the dashed line surrounding the via pad. The other three vias 302b, 302c, and 302d are of substantially the same construction with the addition of component pads to vias 302b and 302d as will be described below.

Further evident in FIG. 3 is component pad 307 upon which a terminal of a surface-mount component may be soldered. Component pad 307 comprises via pad 307a, component landing pad 307b, and supplemental conductive area 307c. Normally component pad 307 comprises a single conductive element. Via pad area 307a operates as per normal for a via pad. Component landing pad 307b provides an area for conductive attachment, typically via soldering, of an electrode of a surface mount component. Supplemental conductive area 307c provides additional conductivity which acts to lower the equivalent series resistance to the electrode of the surface mount component. In some embodiments component landing pad 307b is angled at 70° from the reference line connecting vias 302c and 302d. This angle has been found to be advantageous for maintaining adequate insulative spacings.

Further evident in FIG. 3 is component pad 308 located at via 302b which has dimensions and elements similar to component pad 307. Component pads 307 and 308 are sized such that an 0204 surface mount component may be conductively attached between them. As well, component pads 307 and 308 are spaced apart sufficiently to provide the insulative standoff distance necessary for circuit operation. Prior to component mounting on component pads 307 and 308, a solder resist film (not shown) is normally applied over the component pads to prevent inadvertent solder contact to other vias, the solder resist film having appropriately sized openings for allowing conductive mounting of the surface mount component to the component pads.

Figure 4:
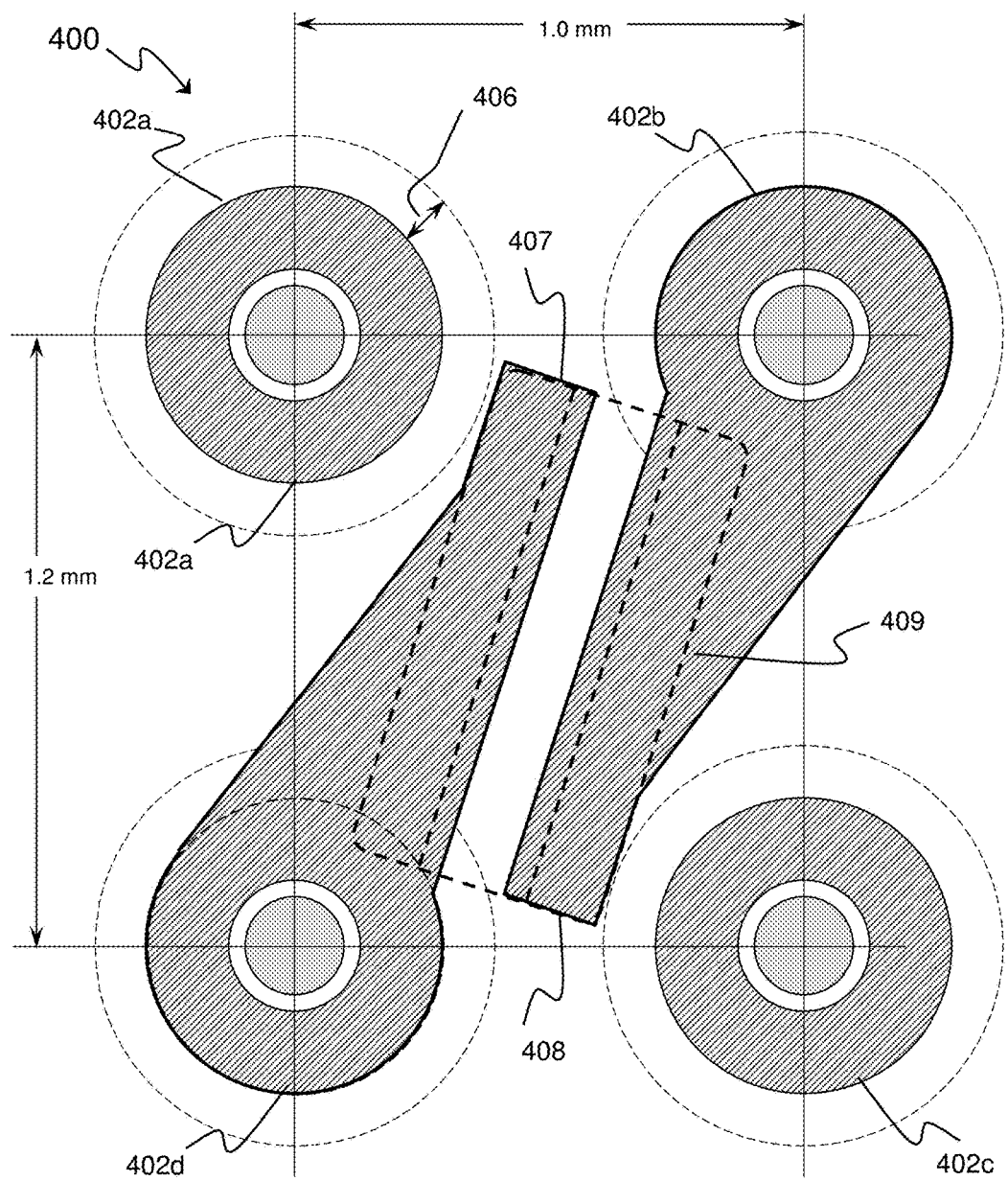
FIG. 4 shows alternative component mounting according to another embodiment of the invention.

FIG. 4 shows a bottom view of a portion of a fine-pitch circuit board according to an embodiment of the invention following the details previously described in FIG. 3. This includes a portion of a circuit board 400, which contains a standard ball grid array (BGA) of BGA pads on the top side (not shown) and a set of vias also arranged on a grid spaced which is offset from the BGA pad grid, such that they do not overlap the BGA pads. The vias have pads 402 are which are labeled (402a, 402b, 402c, and 402d), but other vias may be present outside of the rectangular area defined by these vias. Also evident in FIG. 4 are component pads 407 and 408 upon which a terminal of a surface-mount component may be soldered. Further evident in FIG. 4 in an exemplary embodiment, is a two-terminal surface mount component depicted by outline 409 is a two-lead 0204 component, having a length of 0.002 inches and a width of 0.004 inches. In the embodiment the two-terminal surface mount component is a discrete component. In general, this component is a reverse geometry capacitor that can be used for decoupling. In some applications other component types, such as resistors or inductors may be so placed.

Figure 5:
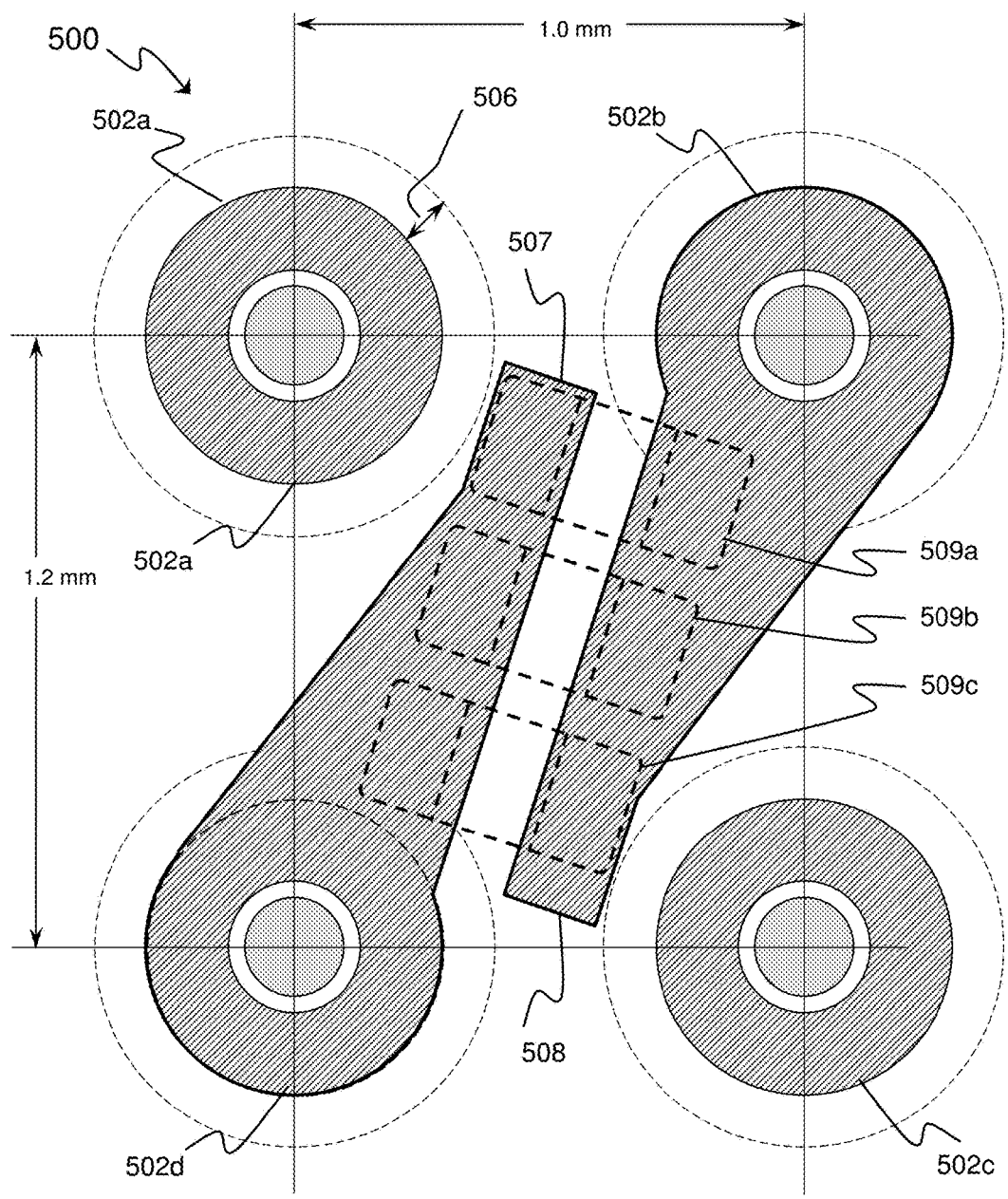
FIG. 5 shows a bottom view of a portion of a fine-pitch circuit board according to an embodiment of the invention following the details previously described in FIG. 3.

Referring now to FIG. 5 there may be seen a bottom view of a portion of a fine-pitch circuit board according to an embodiment of the invention following the details previously described in FIG. 3. This includes a portion of a circuit board 500, which contains a standard ball grid array (BGA) of BGA pads on the top side (not shown) and a set of vias also arranged on a grid spaced which is offset from the BGA pad grid, such that they do not overlap the BGA pads. The vias have pads 502 are which are labeled (502a, 502b, 502c, and 502d), but other vias may be present outside of the rectangular area defined by these vias. Also evident in FIG. 5 are component pads 507 and 508 upon which a terminal of a surface-mount component may be soldered. Further evident in FIG. 5 in an exemplary embodiment, is a set of two-terminal surface mount components depicted by outlines 509a, 509b, and 509c. These components are two-lead 0201 components, having a length of 0.002 inches and a width of 0.001 inches. In the embodiment the two-terminal surface mount components are discrete components. In general, these components are a capacitor that can be used for decoupling. In some applications other component types, such as resistors or inductors may be so placed.

In an exemplary embodiment, a computer aided design tool allows the selection of vias and arrangement of the solder mask, component pads, and vias to be substantially automated. The computer aided design tool may automatically identify appropriate spacing and shape of the solder pad so as to allow placement of the surface mount components on the printed circuit board. A computer aided design tool may also provide instructions to control a machine to manufacture the modified circuit board. Instructions may be exported to the machine or the design tool may directly control the machine.

Thus what has been disclosed is a method a method of placing Reverse Geometry components, including capacitors, within tight-pitch BGAs as well as a method for placing a series of smaller regular geometry surface mount components.

While the figures and descriptions may depict regular circular or rectangular shapes of different elements in exemplary embodiments, it should be understood that alternative shapes may be used such as imperfect polygons and rounded forms. These alternative shapes may be substantially similar to the depicted shapes in area and outline.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:
1. A printed circuit board (PCB) comprising:
a ball grid array (BGA) of BGA pads on one side of the PCB, arranged in a tight-pitch grid pattern;
a set of four of vias, on an opposite side of the PCB from the BGA, spaced in a rectangular arrangement of dimensions 1.2 mm by 1.0 mm that is different from the tight-pitch grid pattern;
two diagonally opposite of said set of four vias having respective component landing pads;
a solder mask covering the component landing pads with respective openings for each of the set of four vias;

a solder pad within each said opening electrically connected respectively to each said component landing pad; and a two-lead component attached to each solder pad.

2. The PCB of claim 1, wherein said component landing pads accommodate an 0204 nominally dimensioned component.

3. The PCB of claim 2, wherein said component landing pads comprise respective component landing pads of substantially rectangular shape.

4. The PCB of claim 3, wherein said component landing pads further comprise a supplemental conductive area.

5. The PCB of claim 1, wherein at least one of said component landing pads has an edge angled at about 70° to a side of the rectangular arrangement defined by the set of four vias.

6. The PCB of claim 1, wherein said component landing pads accommodate a plurality of 0201 nominally dimensioned components.

* * * * *